United States Patent [19]
Kaida et al.

[11] Patent Number: 6,051,910
[45] Date of Patent: Apr. 18, 2000

[54] THICKNESS EXTENSIONAL VIBRATION MODE PIEZOELECTRIC RESONATOR AND PIEZOELECTRIC RESONATOR COMPONENT

[75] Inventors: Hiroaki Kaida, Moriyama; Mitsuhiro Yamada, Shiga-ken; Jiro Inoue, Omihachiman, all of Japan

[73] Assignee: Murata Manufacturing Co., Ltd., Japan

[21] Appl. No.: 09/075,901

[22] Filed: May 11, 1998

[30] Foreign Application Priority Data

| | | | |
|---|---|---|---|
| May 9, 1997 | [JP] | Japan | 9-119589 |
| Dec. 1, 1997 | [JP] | Japan | 9-330576 |
| Dec. 22, 1997 | [JP] | Japan | 9-353435 |

[51] Int. Cl.$^7$ ..................................... H01L 41/04
[52] U.S. Cl. ................. 310/320; 310/366; 310/359; 310/358; 310/348
[58] Field of Search ..................... 310/320, 357, 310/358, 359, 366, 365

[56] References Cited

U.S. PATENT DOCUMENTS

| | | | |
|---|---|---|---|
| 3,699,484 | 10/1972 | Berlincourt | 310/320 X |
| 4,384,229 | 5/1983 | Inoue et al. | 310/320 X |
| 4,894,580 | 1/1990 | Ogawa | 310/320 |
| 4,900,970 | 2/1990 | Ando et al. | 310/320 |
| 4,918,350 | 4/1990 | Ando et al. | 310/320 |
| 4,939,403 | 7/1990 | Kittaka et al. | 310/320 |
| 5,045,744 | 9/1991 | Ando et al. | 310/320 |
| 5,345,136 | 9/1994 | Takagi et al. | 310/320 |
| 5,808,397 | 9/1998 | Kotani | 310/320 |

*Primary Examiner*—Mark O. Budd
*Attorney, Agent, or Firm*—Graham & James LLP

[57] ABSTRACT

A thickness extensional piezoelectric resonator utilizes harmonics of a thickness extensional vibration mode and has a significantly reduced size and significantly increased capacitance while not being susceptible to the effects of the stray capacitance of a circuit board upon which the resonator is mounted. The resonator includes a piezoelectric strip, first and second excitation electrodes located on one of two respective major surfaces of the piezoelectric strip, and internal electrodes disposed inside the piezoelectric strip. The first and second excitation electrodes are located on opposite sides of the piezoelectric strip. The internal electrodes are located opposite to the first and second excitation electrodes to thereby define a vibrating portion. Vibration-attenuating portions are located on opposite sides of the vibrating portion only along the longitudinal direction of the piezoelectric strip. No vibration-attenuating portions are located in the lateral direction of the piezoelectric strip.

18 Claims, 13 Drawing Sheets

THICKNESS EXTENSIONAL VIBRATION MODE PIEZOELECTRIC RESONATOR AND PIEZOELECTRIC RESONATOR COMPONENT

BACKGROUND OF THE INVENTION

1. Field of the Invention

The present invention relates to a piezoelectric resonator and a piezoelectric resonator component preferably used in various resonators, oscillators, and similar devices and, more particularly, to a thickness extensional vibration mode piezoelectric resonator and a piezoelectric resonator component constructed to maximize use of harmonics of a thickness extensional vibration mode.

2. Description of the Related Art

Piezoelectric resonators are used in various piezoelectric resonator components such as piezoelectric oscillators and piezoelectric filters. Known piezoelectric resonators of this kind utilize various piezoelectric vibration modes, depending on the frequency desired.

An energy-trap piezoelectric resonator utilizing the second-order wave of a thickness extensional vibration mode is disclosed in Japanese Unexamined Patent Publication No. 117409/1989. This piezoelectric resonator is now described with reference to FIGS. 20 and 21.

The piezoelectric resonator shown in FIGS. 20 and 21 is constructed by stacking ceramic green sheets 61, 62 made of a piezoelectric material on top of each other and sintering the sheets 61, 62 together, as shown in the exploded perspective view of FIG. 20. A circular excitation electrode 63 is disposed in the center of the ceramic green sheet 61. The excitation electrode 63 is extended to an end of the ceramic green sheet 61 via an extraction electrode 64. A circular excitation electrode 65 is disposed in the center of the top surface of the ceramic green sheet 62. The excitation electrode 65 is extended to an end of the ceramic green sheet 62 via an extraction electrode 66. As shown in the lower projected view of FIG. 20, an excitation electrode 67 is disposed on the bottom surface of the ceramic green sheet 72. The excitation electrode 67 is extended to an end of the ceramic green sheet 62 via an extraction electrode 68. It is noted that the electrodes 63, 65, 67 are only partially formed and only partially cover the respective surfaces of the green sheets 61, 62, 72, respectively at a central portion thereof and do not extend across an entire width or length of the sheets 61, 62, 72. That is, the circular electrodes 63, 65, 67 are surrounded in all directions by the surfaces of the respective green sheets 61, 62, 72.

The ceramic green sheets 61 and 62 are stacked on top of each other and pressure is applied in the direction of thickness thereof. Then, the sheets 61, 62 are sintered, thus producing a sintered body. The sintered body is then polarized. Thus, a piezoelectric resonator 70 is obtained, as shown in FIG. 21.

In the piezoelectric resonator 70, piezoelectric layers 71 and 72 are polarized uniformly in the direction of the arrows, i.e., in the direction of thickness.

When the device shown in FIG. 21 is driven, the excitation electrodes 63 and 67 are connected together, and an AC voltage is applied between the excitation electrodes 63, 67 and the excitation electrode 65. In this way, the piezoelectric resonator 70 is driven to resonate such that the vibration energy is confined to a region where the excitation electrodes 63, 65, 67 overlap each other, i.e., a resonating portion A.

The prior art piezoelectric resonator 70 which is constructed to use the harmonics of a thickness extensional vibration mode is designed as an energy-trap piezoelectric resonator as mentioned above. Therefore, in order to function as an energy trap type resonator, this resonator 70 requires vibration-attenuating portions which are located so as to surround the resonating portion A in all directions for attenuating vibrations created therein. More specifically, because the circular electrodes 63, 65 and 67 are surrounded by surfaces of the respective green sheets 61, 62 and 72 at which vibration-attenuating portions are located, the vibration-attenuating portions have a large size compared with the size of the resonating portion. The large size and arrangement of vibration-attenuating portions in all directions around the electrodes 63, 65, 67 and resonating portion A are necessary to sufficiently suppress vibrations. Thus, because large vibration attenuating portions are required to suppress vibrations, it has been difficult to reduce the size of the piezoelectric resonator 70.

On the other hand, Japanese Unexamined Patent Publication No. 235422/1990 discloses an energy-trap piezoelectric resonator that uses a piezoelectric ceramic strip and hardly needs extra piezoelectric substrate portions surrounding the resonating portion to attenuate vibrations.

In this device shown in FIG. 22, an excitation electrode 82a and an excitation electrode 82b are located on the top and bottom major surfaces, respectively, of an elongated piezoelectric substrate 81. The excitation electrodes 82a and 82b extend along the entire width and part of the length of the piezoelectric substrate 81, and are disposed opposite to each other with the piezoelectric substrate 81 located therebetween. The electrodes 82a, 82b overlap each other in the longitudinal center of the piezoelectric substrate 81 to define a resonating portion. The excitation electrodes 82a and 82b extend to longitudinal ends 81a and 81b, respectively, of the piezoelectric substrate 81.

When the piezoelectric resonator 80 is excited into a thickness extensional vibration mode, unwanted vibrations occur due to the dimensional relation between the width W and the thickness T of the piezoelectric substrate 81. Accordingly, Japanese Unexamined Patent Publication No. 235422/1990 discloses that where the fundamental wave is used, W/T=5.33 should be used if the resonance frequency is 16 MHz, and that where the third-order wave is used, setting W/T to approximately 2.87 (where the resonance frequency is approximately 16 MHz) can reduce unwanted spurious waves between resonant and antiresonant frequencies.

As described above, the energy-trap piezoelectric resonator disclosed in Japanese Unexamined Patent Publication No. 117409/1989 and utilizing the second-order wave of a thickness extensional vibration mode needs large vibration-attenuating portions adjacent to the resonating portion. Hence, it is difficult to reduce the size of the resonator.

The energy-trap piezoelectric resonator disclosed in Japanese Unexamined Patent Publication No. 235422/1990 does not require vibration-attenuating portions adjacent to the resonator portion and so a reduction in size can be attained. However, because harmonic waves of a thickness extensional vibration mode are utilized in this resonator, various unwanted spurious waves appear, in addition to the spurious waves between the resonant and antiresonant frequencies. Because this resonator does not have extra portions surrounding the resonating portion, the spurious waves are generated and are not suppressed. As a result, effective and sufficient resonant characteristics can not be achieved in this resonator.

The piezoelectric resonator disclosed in Japanese Unexamined Patent Publication No. 235422/1990 has a relatively small electric capacitance and thus, is susceptible to the effects of stray capacitance of the circuit board or the like.

SUMMARY OF THE INVENTION

To overcome the problems described above, the preferred embodiments of the present invention provide a thickness extensional piezoelectric resonator and a piezoelectric resonator component that maximize use of harmonic waves of a thickness extensional vibration mode, have a significantly reduced size, have large electric capacitance, and are not susceptible to the effects of stray capacitance of a circuit board upon which the resonator and resonator component are mounted.

The preferred embodiments of the present invention also provide a thickness extensional piezoelectric resonator and a piezoelectric resonator component that maximize use of harmonic waves of a thickness extensional vibration mode, have a significantly reduced size, have large electric capacitance, effectively suppress unwanted spurious components and achieve excellent resonant characteristics.

According to a preferred embodiment of the present invention, a thickness extensional vibration mode piezoelectric resonator utilizing harmonics of a thickness extensional vibration mode includes a substantially rectangular piezoelectric plate having first and second surfaces disposed opposite to each other; a first excitation electrode provided on the first surface and a second excitation electrode provided on the second surface, the first and second excitation electrodes being disposed opposite to each other with the piezoelectric plate located therebetween; at least one internal electrode disposed on the piezoelectric plate and at least partially located opposite to the first and second excitation electrodes; the opposing portion of the first and second excitation electrodes, the internal electrode, and the piezoelectric plate defining a resonating portion; a plurality of vibration-attenuating portions disposed on both sides of the resonating portion along only one direction; and the first and second excitation electrodes extending substantially to both sides of the piezoelectric plate in a direction that is substantially perpendicular to the one direction.

With the structure of the preferred embodiments of the present invention described above, the electric capacitance is increased by an amount corresponding to the internal electrode, compared with the prior art thickness extensional vibration mode piezoelectric resonator having no internal electrodes. This arrangement and increased capacitance reduces the adverse effects of the stray capacitance of the mounted circuit board upon which the resonator is mounted. Thus, a thickness extensional piezoelectric resonator having excellent resonant characteristics is achieved. In addition, vibration-attenuating portions are provided along only one direction. No vibration-attenuating portions are provided on opposite sides of the vibrating portion in a direction that is substantially perpendicular to the one direction along which the vibration-attenuating portions are located. As a result, the dimension of the thickness extensional piezoelectric resonator which is perpendicular to the one direction can be decreased. Consequently, it is possible to provide a very small-sized thickness extensional piezoelectric resonator.

The preferred embodiments of the present invention further provide a thickness extensional vibration mode piezoelectric resonator utilizing harmonics of a thickness extensional vibration mode and including a substantially rectangular piezoelectric plate having first and second surfaces disposed opposite to each other; a first excitation electrode and a second excitation electrode provided on the first and second surfaces, respectively and opposed to each other via the piezoelectric plate; at least one internal electrode disposed in the piezoelectric plate and at least partially located opposite to the first and second excitation electrodes; wherein the piezoelectric plate is made of a piezoelectric material having a piezoelectric constant $d_{31}$ defined by $|d_{31}| \leq 20 \times 10^{-12}$ C/N.

With the preferred embodiment of a thickness extensional vibration mode piezoelectric resonator described above, unwanted spurious vibrations caused by lateral modes and harmonics other than the harmonic desired to be used, are effectively suppressed. As a result, a thickness extensional piezoelectric resonator having excellent resonant characteristics is achieved.

The piezoelectric plate made of a piezoelectric material having a piezoelectric constant $d_{31}$ defined by $|d_{31}| \leq 20 \times 10^{-12}$ C/N can also be utilized for the thickness extensional vibration mode piezoelectric resonator which is described as the first preferred embodiment above.

Since internal electrodes are present in the resonator according to preferred embodiments of the present invention, the electric capacitance is large. Therefore, the adverse effects of the stray capacitance of the circuit board are suppressed.

Also, there are no vibration-attenuating portions located or formed on either side of the vibrating portion in a direction that is substantially perpendicular to the one direction. Therefore, the size of the piezoelectric resonator can be significantly reduced. The piezoelectric plate is preferably made of a piezoelectric material having a piezoelectric constant whose absolute value $d_{31}$ is no greater than about $20 \times 10^{-12}$ C/N. As a result, unwanted spurious components are effectively suppressed.

Therefore, a small-sized thickness extensional vibration mode piezoelectric resonator having excellent resonant characteristics is achieved.

In the thickness extensional vibration mode piezoelectric resonator according to preferred embodiments of the present invention, the piezoelectric plate may have an elongated piezoelectric strip shape.

With the structure and arrangement according to preferred embodiments of the present invention, the reduction in size of the thickness extensional piezoelectric resonator can still be achieved.

According to another preferred embodiment, a thickness extensional vibration mode piezoelectric resonator constructed according to the description of other preferred embodiments above may further include a capacitor disposed on the first and second surfaces of the piezoelectric plate with a space therebetween to allow the piezoelectric resonator to vibrate unimpeded. With this structure, a capacitor is mounted to the above described thickness extensional piezoelectric resonator via a space that is arranged so as to not impede vibrations of the resonator. Therefore, a piezoelectric oscillator having a built-in capacitor can be constructed using the piezoelectric oscillator having excellent resonant characteristics and producing less spurious components.

The preferred embodiments of the present invention further provide a piezoelectric resonator component including a first case member and a second case member which define a casing; electrode lands provided on a top surface of the first case member; a plurality of outer electrodes electrically connected to the electrode lands and extending to an outer surface of the casing; a plate-shaped capacitor fixed to the top surface of the first case member via a conductive bonding material and electrically connected to the electrode lands; the above-described thickness extensional vibration mode piezoelectric resonator being bonded to the plate-shaped capacitor via a conductive bonding material while defining a space which allows the resonator to vibrate freely; and the second case member being fixedly mounted to the first case member so as to surround the plate-shaped capacitor and the thickness extensional vibration mode piezoelectric resonator stacked on the top surface of the first case member. With this structure, a thickness extensional piezoelectric resonator and a plate-shaped capacitor are stacked over a first case member and a second case member is bonded to the first case member to define a casing. The plate-shaped capacitor and the thickness extensional piezoelectric resonator are disposed in the internal space. Consequently, a small-sized chip-type piezoelectric resonator that incorporates the capacitor in the form of a chip, uses a thickness extensional piezoelectric resonator, and is not susceptible to the effects of the stray capacitance, can be provided. Since the plate-shaped capacitor is stacked and fixed via the thickness extensional piezoelectric resonator and conductive bonding materials, even if the thickness extensional piezoelectric resonator is thin, the plate-shaped capacitor reinforces the thickness extensional piezoelectric resonator. Hence, the resistance of the thickness extensional piezoelectric resonator to mechanical shock is enhanced.

If the lateral dimension of the capacitor is larger than the lateral dimension of the thickness extensional piezoelectric resonator, the thickness extensional piezoelectric resonator is effectively prevented from touching the inner surface of the second case member of the resonator during assembly. The yield of the thickness extensional vibration mode piezoelectric resonator component is therefore improved.

Other features and advantages of the present invention will become apparent from the following description of the invention which refers to the accompanying drawings.

DETAILED DESCRIPTION OF PREFERRED EMBODIMENTS

Figure 1:
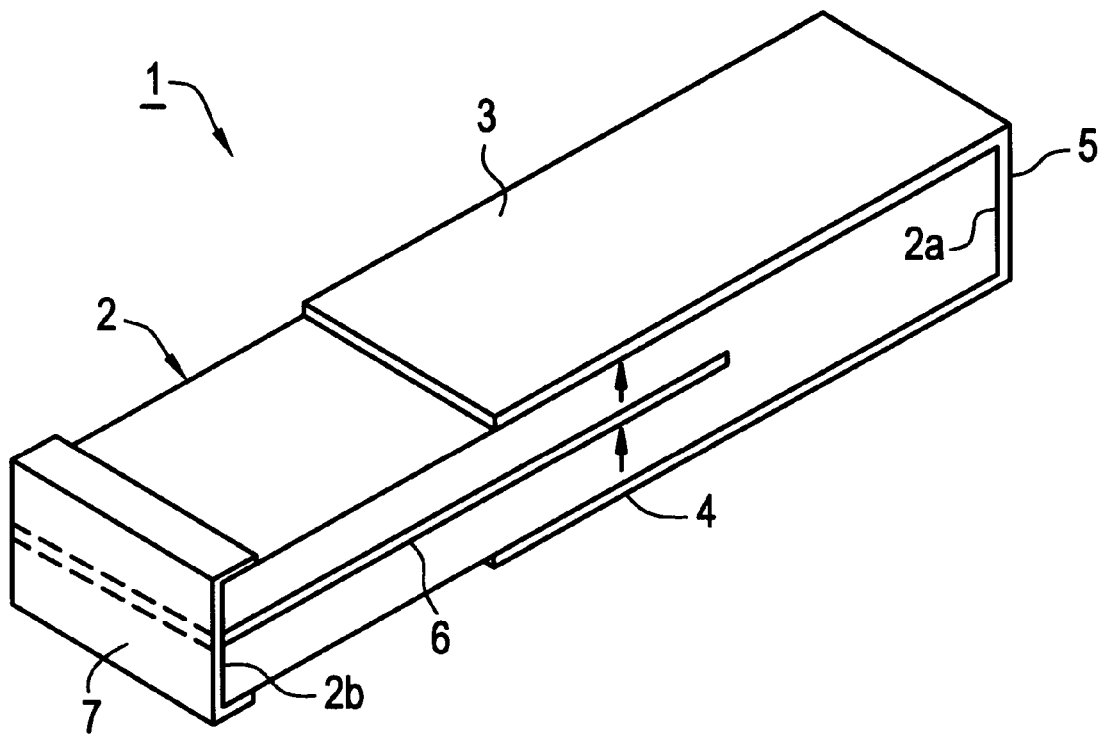
FIG. 1 is a perspective view showing a thickness extensional piezoelectric resonator according to a first preferred embodiment of the invention.
Figure 2:
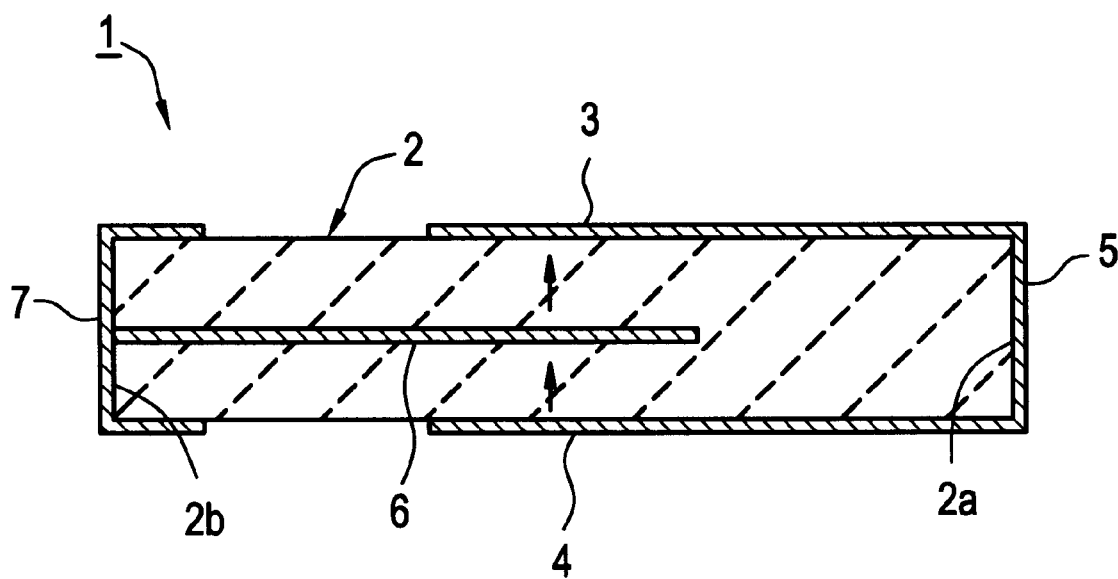
FIG. 2 is a cross-sectional view of the thickness extensional piezoelectric resonator according to the first preferred embodiment.

FIG. 1 is a perspective view showing a thickness extensional piezoelectric resonator according to a first preferred embodiment of the present invention. FIG. 2 is a cross-sectional view of the resonator shown in FIG. 1.

A thickness extensional piezoelectric resonator 1 preferably includes of an elongated, substantially rectangular piezoelectric strip 2 preferably made of a piezoelectric ceramic material such as a lead zirconate titanate-based ceramic. The piezoelectric material preferably has a piezoelectric constant, $d_{31}$ defined by $|d_{31}| \leq 20 \times 10^{-12}$ C/N, for example. However, other piezoelectric materials having other piezoelectric constants may be used.

The piezoelectric strip 2 is polarized uniformly in the direction of thickness as indicated by the arrows in FIGS. 1 and 2. A first excitation electrode 3 is disposed on the top surface of the piezoelectric strip 2. A second excitation electrode 4 is disposed on the bottom surface of the piezoelectric strip. Excitation electrodes 3 and 4 extend from one end 2a of the piezoelectric strip 2 toward the other end 2b on the top and bottom surfaces of the piezoelectric strip 2. However, the electrodes 3, 4 do not reach the other end 2b of the piezoelectric strip 2.

The excitation electrodes 3 and 4 are connected together via a connecting electrode 5 disposed on the end surface 2a of the piezoelectric strip 2.

An internal electrode 6 is preferably located at substantially a middle level within the piezoelectric strip 2. The internal electrode 6 is preferably extended to the end surface 2b of the piezoelectric strip 2 and electrically connected with a terminal electrode 7 disposed on the end surface 2b.

During operation, an AC voltage is applied between the first and second excitation electrodes 3, 4 and the internal electrode 6, thus inducing the second-order wave of the thickness extensional vibration mode strongly so as to maximize use of harmonics of the thickness extensional vibration. Thus, the resonator can be used as a piezoelectric resonator utilizing the second-order wave of thickness extensional vibration mode.

In the present preferred embodiment, the first and second excitation electrodes 3 and 4 are preferably stacked over the internal electrode 6 via the piezoelectric layer in the longitudinal center of the piezoelectric strip 2. Therefore, in the portion of the piezoelectric strip 2 where the internal electrode 6 overlaps the first and second excitation electrodes 3, 4, an energy-trap resonating portion is defined. When this resonating portion is resonating, the energy is attenuated by the piezoelectric portions extending from the resonating portion to the end surfaces 2a and 2b.

If the above-described resonating portion is located at what is considered an approximate central portion of the resonator 2 along a length thereof, vibration-attenuating portions are located at only longitudinally opposite sides along the longitudinal direction of the piezoelectric strip 2. That is, the vibration-attenuating portions are not located around the resonating portion along a widthwise direction of the piezoelectric strip. The first and second excitation electrodes 3, 4 extend to the sides of the piezoelectric strip in a direction (in the direction of width) that is substantially perpendicular to the longitudinal direction of the piezoelectric strip.

The first and second excitation electrodes 3, 4 and the internal electrode 6 extend along the whole width of the piezoelectric strip 2 only in the resonating portion. Outside the resonating portion, the width of the first and second excitation electrodes 3, 4 can be reduced. For example, the excitation electrode 3 needs to extend along the whole width of the piezoelectric strip 2 only in the resonating portion. The portion of the excitation electrode 3 on the side of the end surface 2a may be thinner than the width at the resonating portion, because this portion of the electrode 3 simply electrically connects the excitation electrode with the connecting electrode 5.

In the thickness extensional vibration mode resonator according to preferred embodiments of the present embodiment, vibration-attenuating portions are defined on opposite sides of the vibrating portion only along the longitudinal direction of the piezoelectric body 2. No vibration-attenuating portions are present or defined at locations extending across the piezoelectric body 2. Therefore, the width of the thickness extensional vibration mode resonator 1 is significantly reduced. Consequently, the piezoelectric resonator is greatly reduced in size.

In addition, the resonator has a greater electric capacitance than the prior art thickness extensional vibration mode piezoelectric resonator 80 having no internal electrodes, because the first and second excitation electrodes 3, 4 and the internal electrodes 6 are stacked via the piezoelectric layer. Also, the resonator is less affected by and much more resistant to the stray capacitance of the circuit board.

Furthermore, the electric capacitance is increased by the arrangement of the first and second excitation electrodes 3 and 4, respectively, extending up to the lateral sides of the piezoelectric resonator 2. Hence, the resonator is not susceptible to the effects of the stray capacitance of the circuit board.

Unlike the prior art strip-type thickness extensional piezoelectric resonator, the thickness extensional piezoelectric resonator 1 according to preferred embodiments of the present embodiment effectively suppresses unwanted spurious vibrations caused by lateral-mode vibrations, as will be described by referring to FIGS. 3–8.

Figure 6:
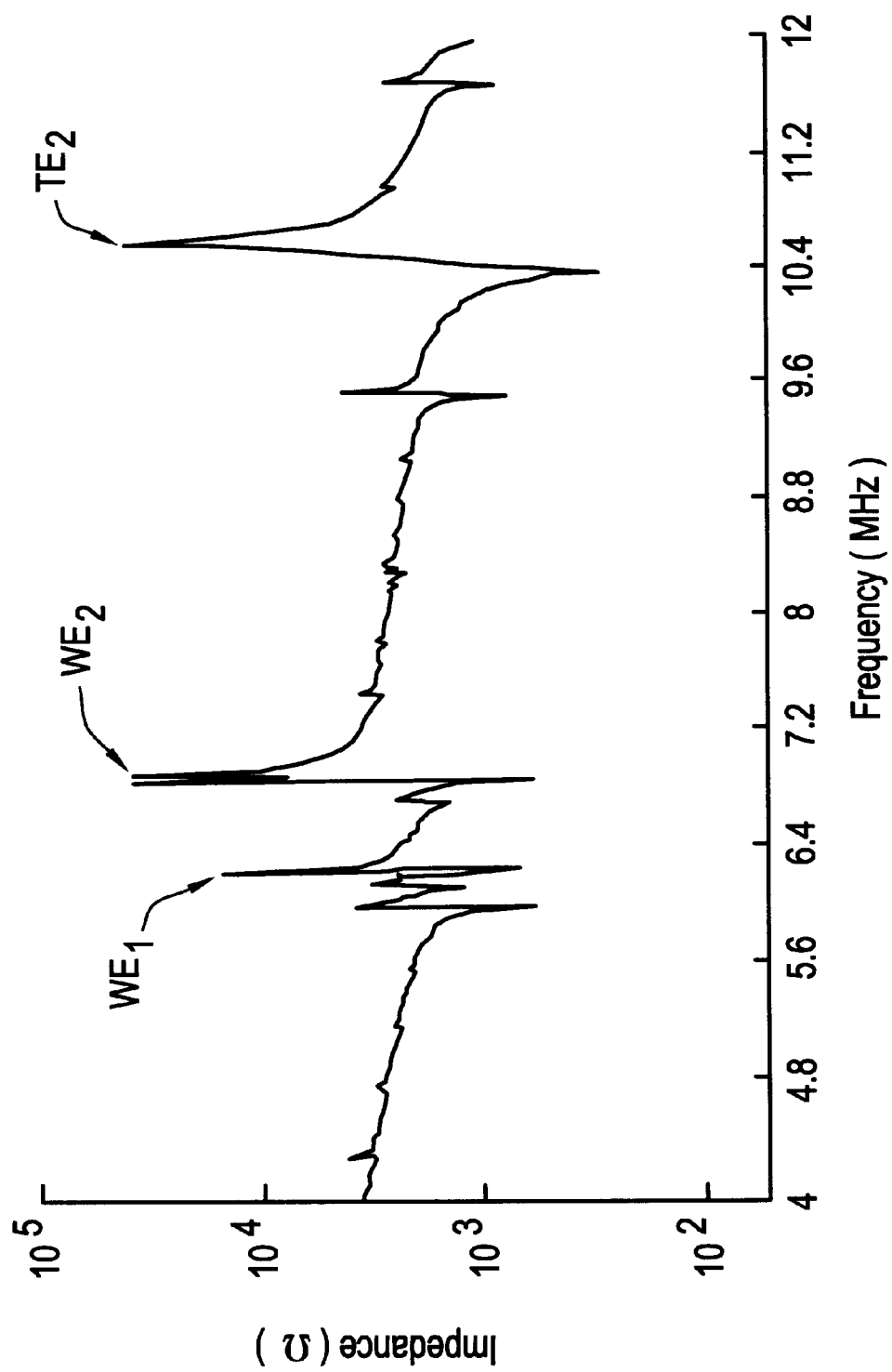
FIG. 6 is a diagram illustrating the impedance-frequency characteristics, depicting lateral modes $WE_1$ and $WE_2$ appearing as spurious vibrations in the prior art thickness extensional piezoelectric resonator.
Figure 22:
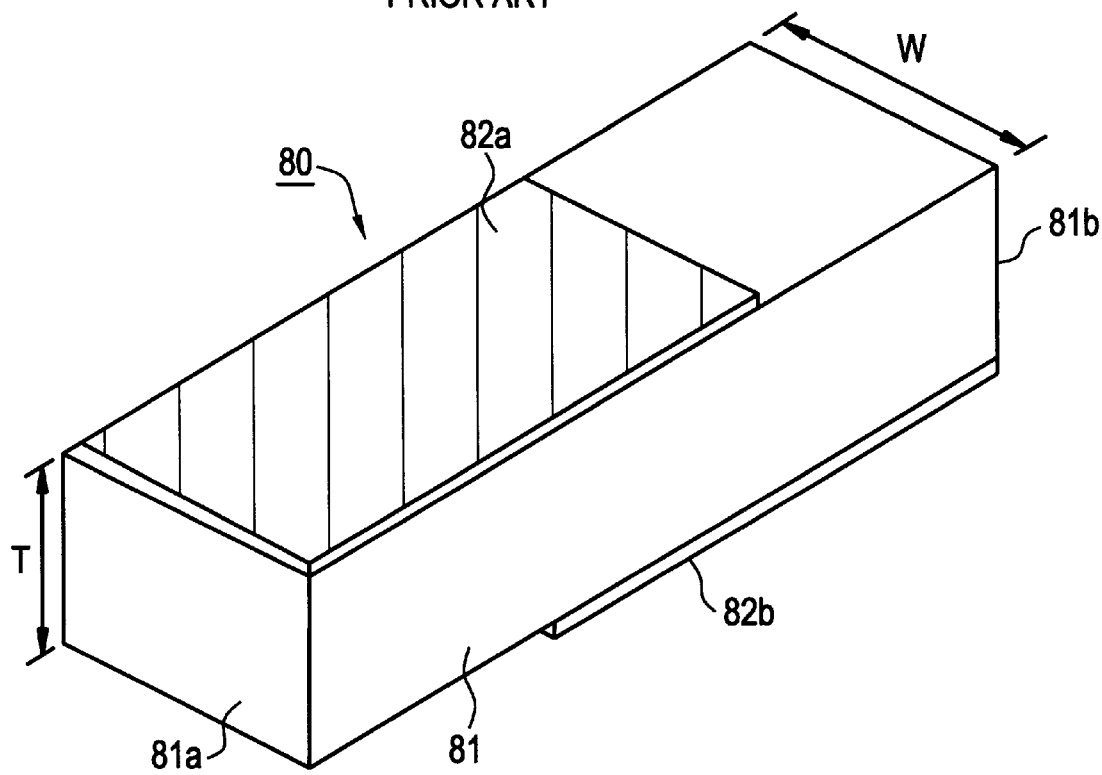
FIG. 22 is a perspective view illustrating another example of a prior art thickness extensional piezoelectric resonator.

In the prior art strip-type piezoelectric resonator 80 shown in FIG. 22, a lateral mode determined by the width W of a piezoelectric substrate 81 produces strong resonance. The impedance-frequency characteristic of this prior art piezoelectric resonator 80 is shown in FIG. 6, where a vibration mode indicated by the arrow $TE_2$ is the second-order wave of a thickness extensional vibration mode and responses indicated by $WE_1$ and $WE_2$ are spurious vibrations caused by the lateral mode. The impedance-frequency characteristic shown in FIG. 6 is the characteristic of the piezoelectric resonator 80 having a resonance frequency of 10 Mhz. As can be seen from FIG. 6, a lateral-mode spurious vibration indicated by $WE_1$ appears near 6 MHz, and a lateral-mode spurious vibration indicated by $WE_2$ appears near 7 MHz. It is seen from FIG. 6 that both spurious vibrations are considerably strong.

Figure 3:
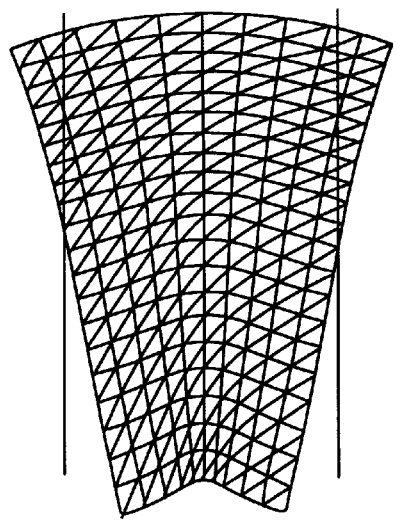
FIG. 3 is a diagram illustrating the distribution of displacements in a lateral mode $WE_1$ of a piezoelectric body, the distribution being analyzed by the finite element method.
Figure 4:
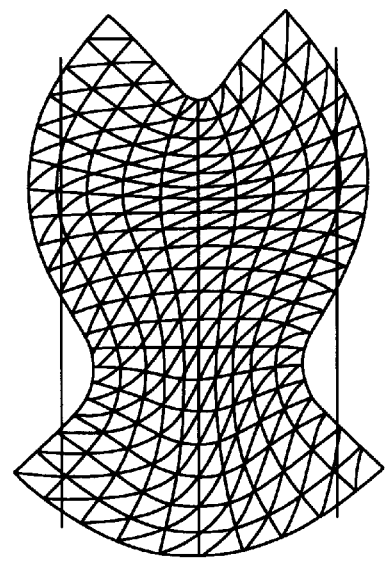
FIG. 4 is a diagram illustrating the distribution of displacements in a lateral mode $WE_2$ of a piezoelectric body, the distribution being analyzed by the finite element method.
Figure 5:
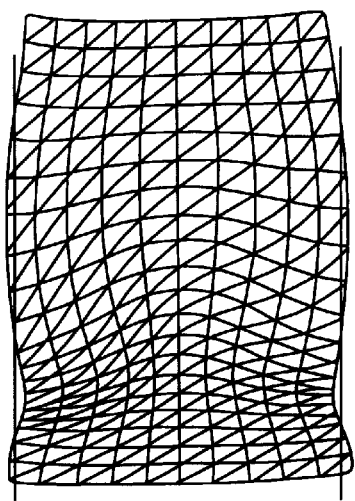
FIG. 5 is a diagram illustrating the distribution of displacements of second-order waves of thickness extensional vibrations, the distribution being analyzed by the finite element method.

The inventors of the present invention described herein analyzed the displacements of the piezoelectric resonator at the lateral-mode spurious vibrations $WE_1$ and $WE_2$. Results shown in FIGS. 3 and 4 were obtained. FIGS. 3–5 are horizontal cross sections of a thickness extensional piezoelectric resonator in a strip form, schematically showing the displacements of surfaces of the strip-type piezoelectric resonator when taken in a direction perpendicular to the longitudinal direction and in the direction of thickness.

FIG. 3 is a diagram showing a state in which vibrations occur in the lateral-mode $WE_1$. FIG. 4 is a diagram illustrating the distribution of displacements in the lateral-mode $WE_2$. FIG. 5 is a diagram illustrating displacements in the second-order waves $TE_2$ of a thickness extensional vibration mode. As can be seen by comparison of FIGS. 3 and 4 with FIG. 5, the piezoelectric body deforms compressionally in the direction of thickness in the case of the second-order waves $TE_2$ of a thickness extensional vibration mode. On the other hand, in the lateral modes $WE_1$ and $WE_2$, the piezoelectric resonator is greatly displaced laterally.

Based on this discovery, the inventors set out to suppress the spurious vibrations caused by the lateral modes $WE_1$ and $WE_2$ described above and discovered that if the piezoelectric strip 2 of the thickness extensional piezoelectric resonator 1 shown in FIG. 1 is made of certain materials, the responses of the lateral modes $WE_1$ and $WE_2$ are significantly reduced, and only the second-order wave $TE_2$ of the thickness extensional vibration mode is excited strongly to thereby maximize the use of harmonics of the thickness extensional vibration mode.

Figure 7:
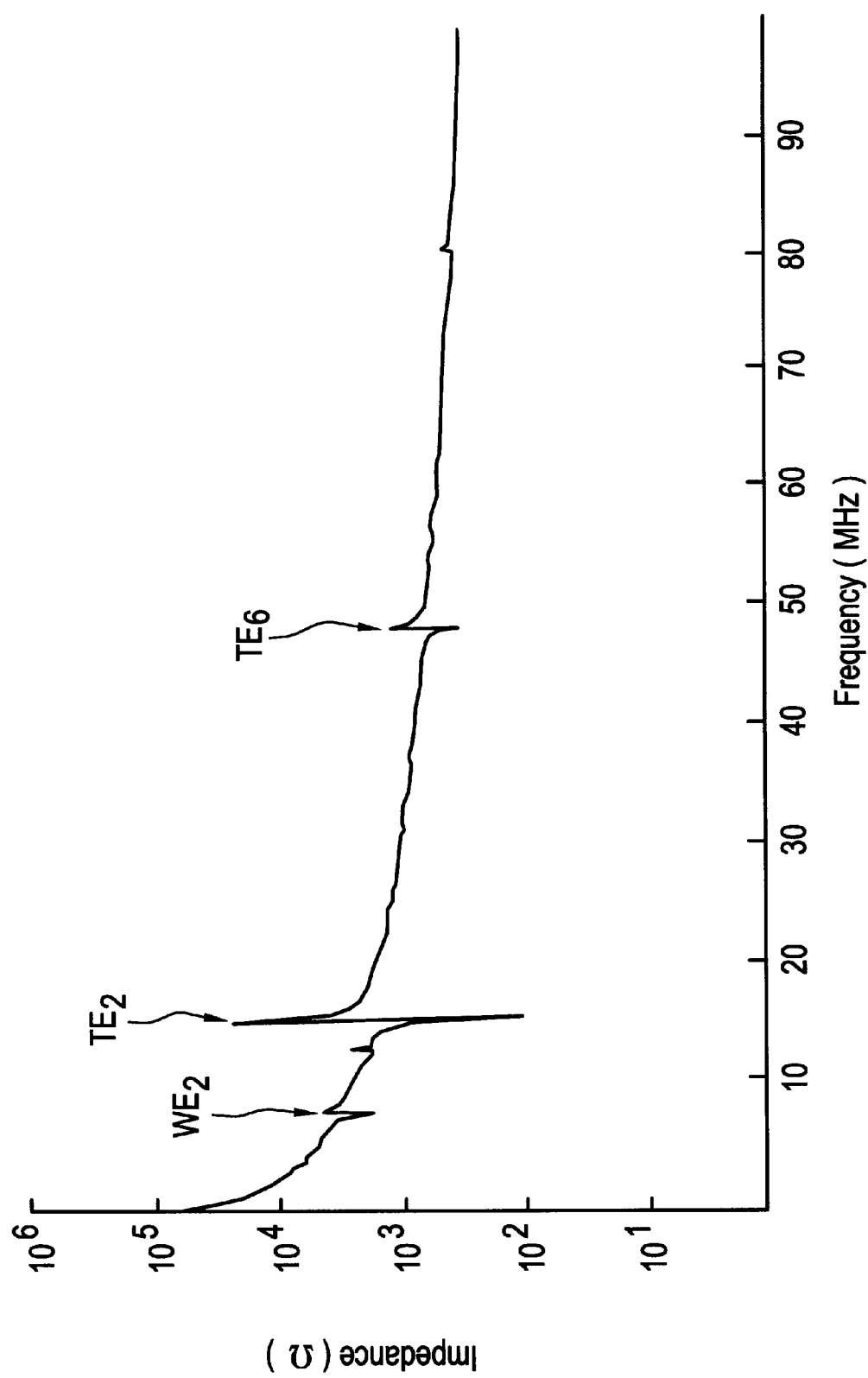
FIG. 7 is a diagram illustrating the impedance-frequency characteristics of a thickness extensional piezoelectric resonator according to a first preferred embodiment of the present invention.

The impedance-frequency characteristic of the piezoelectric resonator 1 according to preferred embodiments of the present invention is shown in FIG. 7. The impedance-frequency characteristic is derived under conditions where the piezoelectric strip 2 is preferably made of a lead titanate-based piezoelectric ceramic with $-d_{31}=9\times10^{-12}$ C/N. As can be seen from FIG. 7, in the piezoelectric resonator 1 according to the present preferred embodiment, the second-order wave of the thickness extensional vibration mode indicated by the arrow $TE_2$ is excited strongly. The magnitude of the lateral-mode spurious vibration $WE_2$ is significantly reduced as compared to the prior art. Although it is not clear from FIG. 7, both lateral modes $WE_1$ and $WE_2$ are similarly attenuated greatly.

Since the responses $WE_1$ and $WE_2$ caused by lateral modes are closer to the second-order wave $TE_2$ of the thickness extensional vibration mode than the sixth-order wave $TE_6$ of the thickness extensional vibration mode, the responses of the lateral-mode responses $WE_1$ and $WE_2$ are preferably smaller than that of the sixth-order wave $TE_6$.

Figure 8:
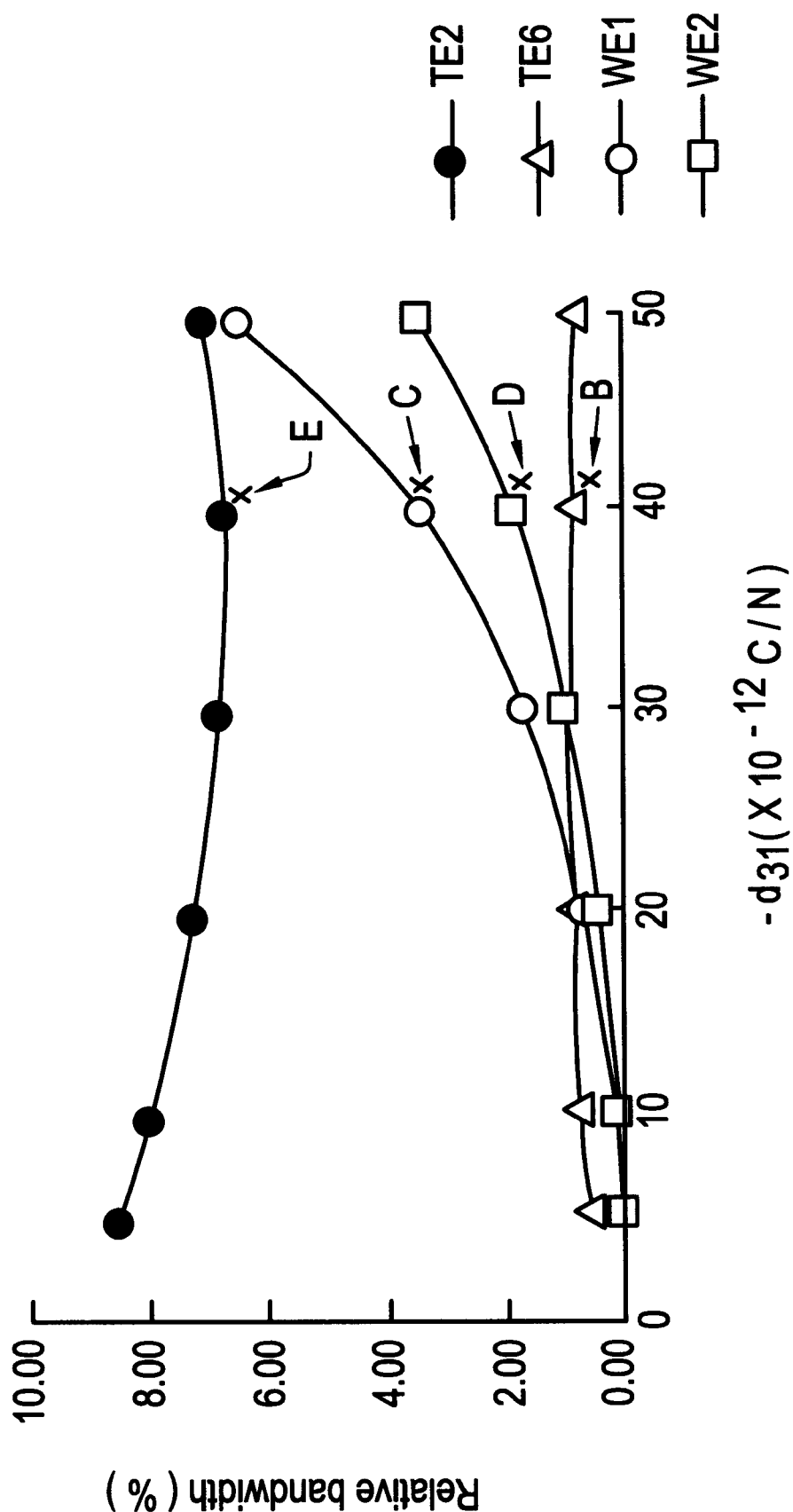
FIG. 8 is a diagram illustrating the relation between the absolute value of piezoelectric constant $d_{31}$ and relative bandwidth.

On the other hand, the characteristic shown in FIG. 6 is derived from the piezoelectric strip 2 made of a lead titanate zirconate-based ceramic with $d_{31}=-42\times10^{-12}$ C/N.

Where the piezoelectric strip 2 is made of the above-described lead zirconate titanate-based ceramic, an excellent characteristic was obtained as shown in FIG. 7. In view of this fact, the piezoelectric constant $d_{31}$ of the piezoelectric material used to form the piezoelectric strip 2 was varied, and the resulting relative bandwidths were examined by the finite element method. The results are shown in FIG. 8.

The relative bandwidth is defined by:

$$(fa-fr)\times 100/fa \ (\%)$$

where fr is a resonant frequency and fa is an antiresonant frequency.

As can be seen from FIG. 8, if the piezoelectric constant $d_{31}$ is varied, the relative bandwidth changes. Especially, when the constant exceeds $20\times10^{-12}$ C/N, the lateral-mode $WE_1$ increases. When the piezoelectric constant $d_{31}$ is $50\times10^{-12}$ C/N, the second-order wave $TE_2$ and the lateral-mode $WE_1$ have an identical response. Therefore, it can be understood that where the piezoelectric constant $d_{31}$ is less than about $20\times10^{-12}$ C/N, the responses of the lateral modes $WE_1$, $WE_2$ and of the sixth-order wave $TE_6$ can be effectively suppressed without reducing the response of the second-order wave $TE_2$.

Various points indicated by the arrows B–E in FIG. 8 show actually measured values of the relative bandwidths of the sixth-order wave, the lateral modes $WE_1$, $WE_2$, and the second-order wave where a lead titanate zirconate-based ceramic ($-d_{31}=42\times10^{-12}$ C/N) is used as a piezoelectric material.

Thus, it can be seen that the relative bandwidth of a piezoelectric resonator built, using the lead titanate zirconate-based ceramic having a dielectric constant $d_{31}=-42\times10^{-12}$, agrees with the result of the analysis by the above-described finite element method.

In the thickness extensional piezoelectric resonator 1 according to preferred embodiments of the present embodiment, the absolute value of the piezoelectric constant $d_{31}$ of the piezoelectric strip 2 is preferably less than about $20\times10^{-12}$ C/N. Therefore, it is clear that in the piezoelectric resonator of preferred embodiments of the present invention adapted to use the second-order wave $TE_2$ of a thickness extensional vibration mode, unwanted spurious vibrations caused by the lateral modes $WE_1$, $WE_2$ and caused by the sixth-order wave $TE_6$ are effectively suppressed. Consequently, excellent resonant characteristics are achieved.

In the thickness extensional piezoelectric resonator 1 according to the first preferred embodiment, the piezoelectric strip 2 is polarized uniformly in the direction of thickness. The piezoelectric resonator is connected in a parallel configuration such that the applied electric field is reversed relative to each of the successive layers. The present invention may also be applied to a series-connection type piezoelectric resonator in which plural piezoelectric layers are oppositely polarized in an alternating manner along the direction of thickness. A thickness extensional piezoelectric resonator of such a series type is shown in FIG. 9.

Figure 9:
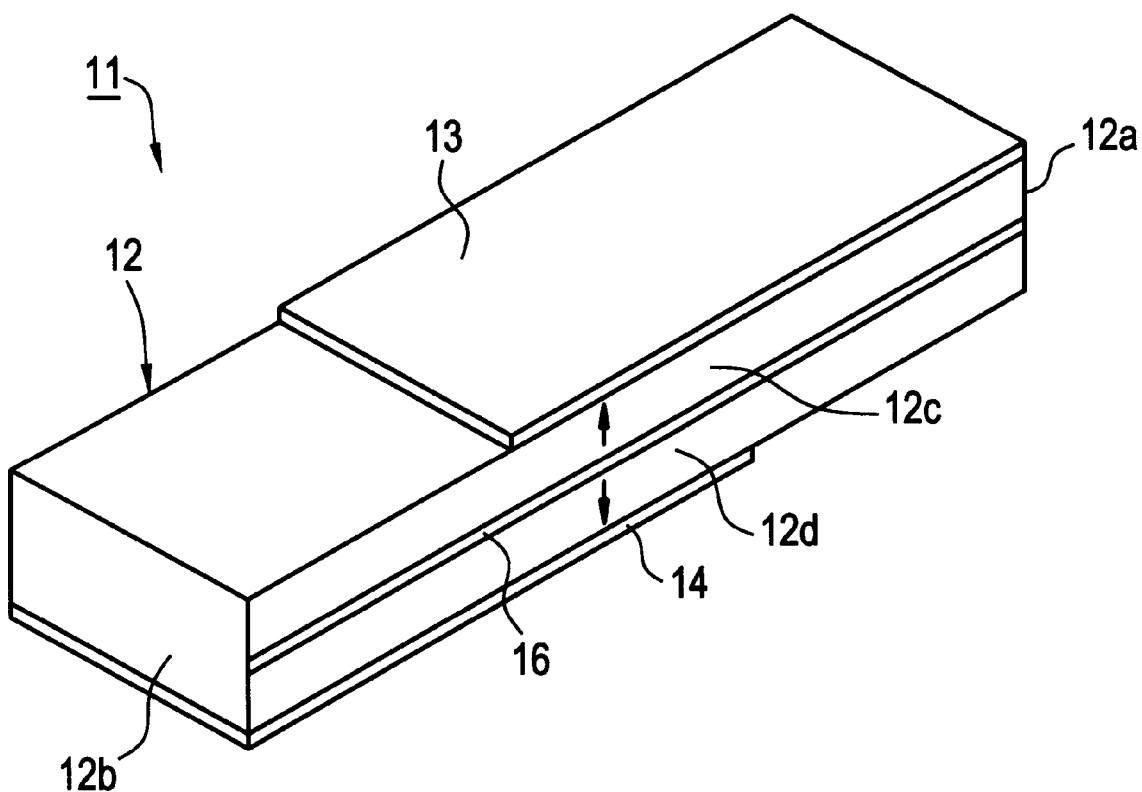
FIG. 9 is a perspective view illustrating a thickness extensional piezoelectric resonator according to a second preferred embodiment of the invention.

A thickness extensional piezoelectric resonator, 11, shown in FIG. 9 preferably includes an elongated piezoelectric strip 12. A first excitation electrode 13 is disposed on the top surface of the piezoelectric strip 12. A second excitation electrode 14 is disposed on the bottom surface. The first and second excitation electrodes 13 and 14, respectively, are located on opposite sides of the piezoelectric strip 12. The first and second excitation electrodes 13 and 14 are arranged to be opposite to each other at the longitudinal center of the piezoelectric strip 12. The portion of the piezoelectric strip 12 where the first and second excitation electrodes 13 and 14 are opposite to each other defines an energy-trap resonator portion.

Also, in the present preferred embodiment, the first and second excitation electrodes 13 and 14 are preferably extended to end surfaces 12a and 12b, respectively, of the piezoelectric strip 12. The portions of the electrodes 13, 14 other than the portions located at the resonator portion are not required to extend along the whole length of the piezoelectric strip 12.

The excitation electrodes 13 and 14 define an energy-trap resonator portion having vibration-attenuating portions located along only the longitudinal direction of the piezoelectric strip 12. For this purpose, the first and second excitation electrodes 13 and 14 extend to the sides of the piezoelectric strip 12 in a direction vertical to the longitudinal direction, i.e. in a direction of width of the piezoelectric strip 12.

An internal electrode 16 is located at a vertical central portion within the piezoelectric strip 12, and functions to polarize the piezoelectric strip 12. That is, during polarization, piezoelectric layers 12c and 12d are polarized in opposite directions in the direction of thickness as indicated by the arrows by applying a higher voltage and a lower voltage to the internal electrode 16 and the excitation electrodes 13, 14, respectively.

During operation, an AC voltage is applied between the first and second excitation electrodes 13 and 14, respectively. That is, the internal electrode 16 is not used for operation of the resonator but is merely used to provide the alternating opposite polarization to the layers 12c, 12d. The resonator 11 is constructed such that a second-order wave $TE_2$ of a thickness extensional vibration mode is excited.

In the thickness extensional piezoelectric resonator 11 according to the second preferred embodiment, no vibration-attenuating portions are located on opposite sides of the vibrating portion in the lateral or width direction of the piezoelectric strip 12. Vibration-attenuating portions are located on opposite sides of the vibrating portion only along the longitudinal direction of the vibration portion. Therefore, a small-sized thickness extensional vibration mode resonator can be built in the same way as the thickness extensional vibration mode resonator 1 according to the first preferred embodiment. Furthermore, the resonator 11 preferably includes the internal electrode 16 in the same manner as the first preferred embodiment. The excitation electrodes 13 and 14 are preferably extended to the lateral ends of the piezoelectric strip 12. Consequently, the electric capacitance can be increased. Further, the resonator is immune to the effects of the stray capacitance of the circuit board upon which it is mounted.

In the same way as the thickness extensional vibration mode piezoelectric resonator 1 according to the first preferred embodiment, the thickness extensional vibration mode piezoelectric resonator 11 according to the second preferred embodiment effectively suppresses unwanted spurious vibrations caused by lateral modes $WE_1$, $WE_2$, and the sixth-order wave $TE_6$ by fabricating the piezoelectric strip 12 from a material having a piezoelectric constant $d_{31}$ whose absolute value is less than about $20 \times 10^{-12}$ C/N. As a result, excellent resonant characteristics are achieved.

The first and second preferred embodiments provide piezoelectric resonators 1 and 11 both utilizing the second-order wave of a thickness extensional vibration mode. Piezoelectric resonators in accordance with preferred embodiments of the present invention may be constructed to use harmonics other than the second-order wave of a thickness extensional vibration mode. FIGS. 10–13 are cross-sectional views illustrating piezoelectric resonators utilizing such harmonics, and correspond to FIG. 2 used to describe the first preferred embodiment.

Figure 10:
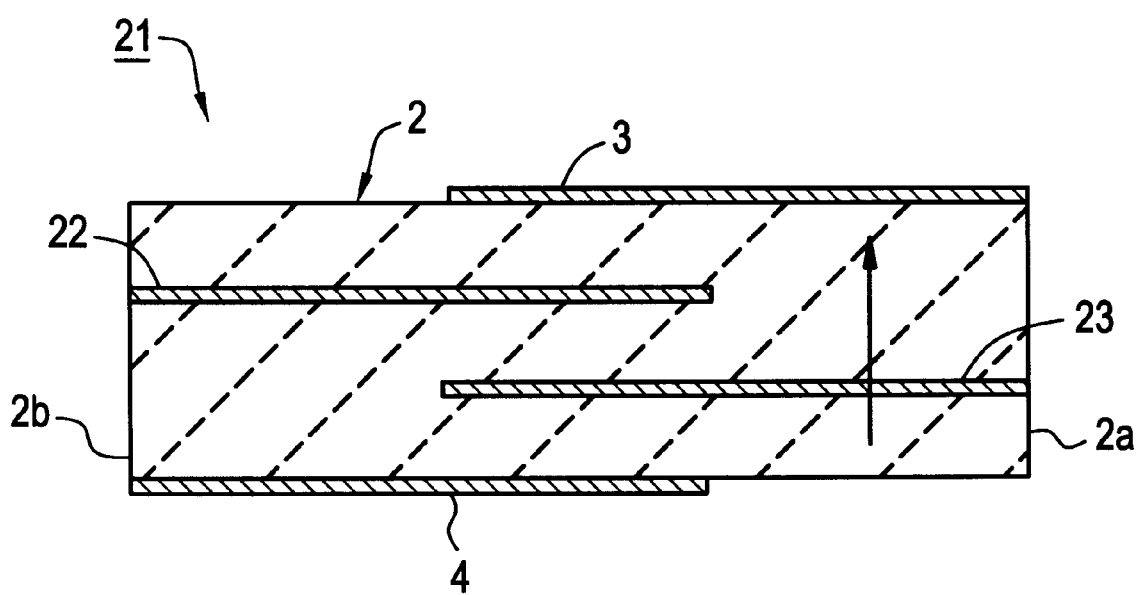
FIG. 10 is a cross-sectional view showing a first modified example of a thickness extensional piezoelectric resonator according to preferred embodiments of the present invention.

FIG. 10 is a parallel-connection type thickness extensional piezoelectric resonator 21, utilizing the third-order wave of a thickness extensional vibration mode. In particular, two internal electrodes 22 and 23 are disposed in a piezoelectric body 2. The piezoelectric body 2 is polarized uniformly in the direction of thickness as indicated by the arrow shown in FIG. 10. Thus, the piezoelectric resonator 21 using the third-order wave of a thickness extensional vibration mode can be built.

Figure 11:
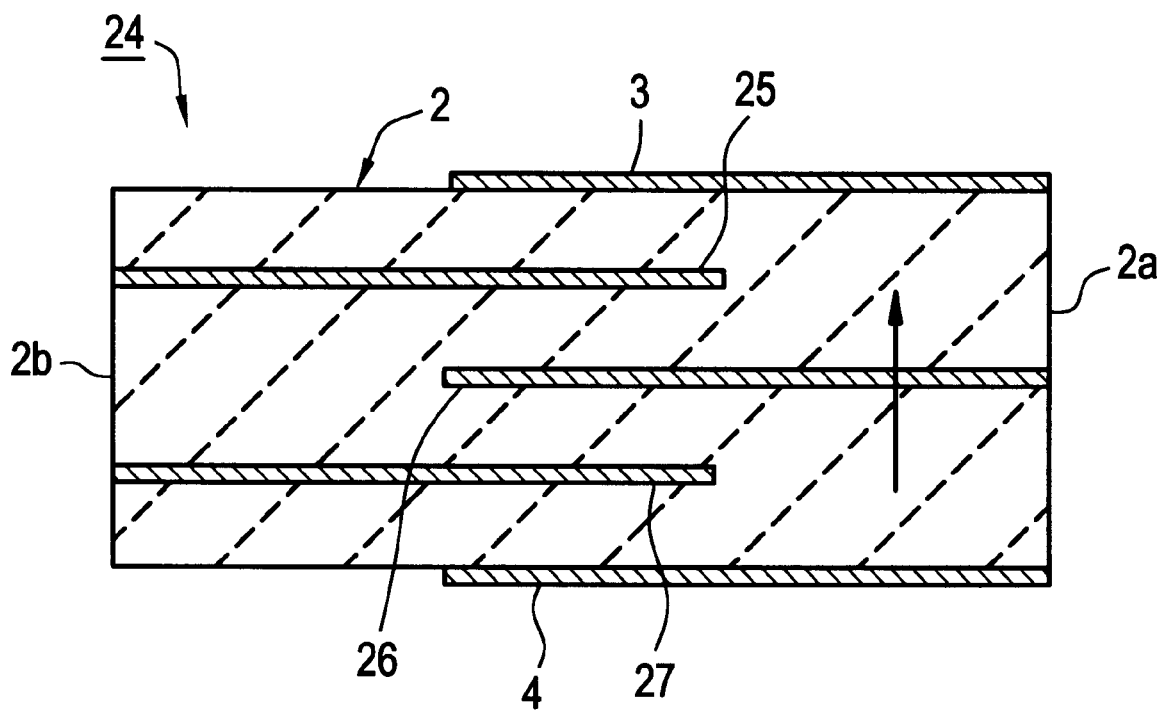
FIG. 11 is a cross-sectional view showing a second modified example of a thickness extensional piezoelectric resonator according to preferred embodiments of the present invention.

A thickness extensional piezoelectric resonator, 24, shown in FIG. 11 is a cross-sectional view showing a parallel-connection type piezoelectric resonator 24 utilizing the fourth-order wave of a thickness extensional vibration mode. In the thickness extensional piezoelectric resonator 24, the piezoelectric strip 2 is polarized uniformly in the direction of thickness. Three internal electrodes 25–27 are spaced from each other in the direction of thickness inside the resonator 24. Consequently, the fourth-order wave of a thickness extensional vibration mode is effectively excited.

Figure 12:
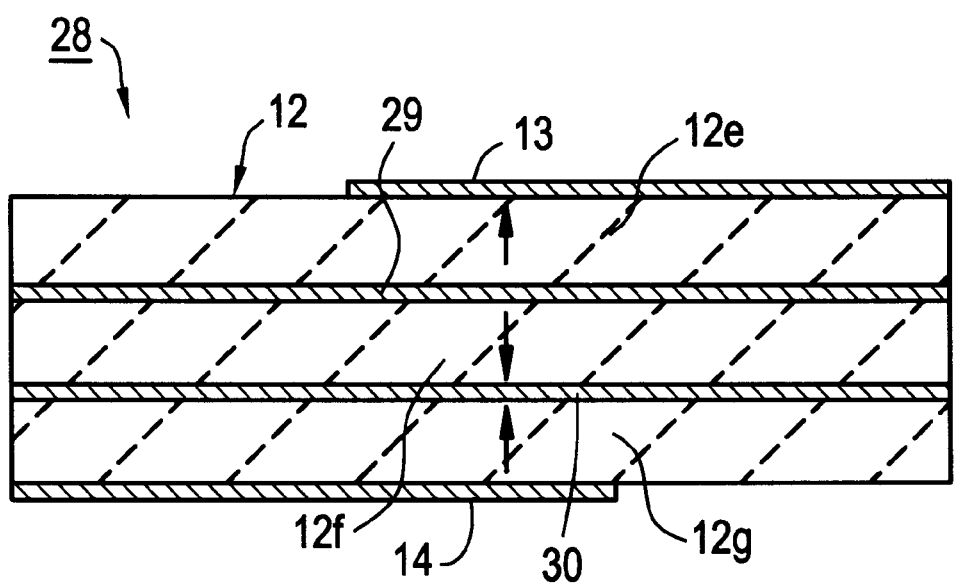
FIG. 12 is a cross-sectional view showing a third modified example of a thickness extensional piezoelectric resonator according to preferred embodiments of the present invention.

FIG. 12 is a cross-sectional view showing a series-connection type thickness extensional piezoelectric resonator, 28, utilizing the third-order wave of a thickness extensional vibration mode. In this thickness extensional piezoelectric resonator 28, two internal electrodes 29 and 30 are disposed in a piezoelectric body 12. The inside of the piezoelectric body 12 is divided into three layers of piezoelectric layers 12e–12g. Polarization is performed, using these internal electrodes 29 and 30, so that piezoelectric layers adjacent to each other in the direction of thickness are polarized in opposite directions. Thus, the third-order wave of a thickness extensional vibration mode can be excited by applying an AC voltage applied to the first and second excitation electrodes 13 and 14.

Figure 13:
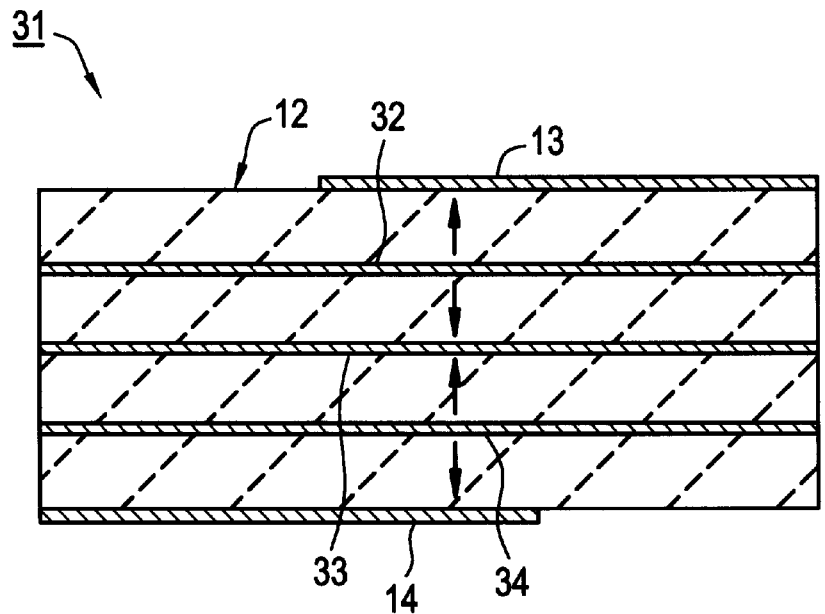
FIG. 13 is a cross-sectional view showing a fourth modified example of a thickness extensional piezoelectric resonator according to preferred embodiments of the present invention.

Similarly, FIG. 13 is a cross-sectional view showing a series-connection type piezoelectric resonator 31, utilizing the fourth-order wave of a thickness extensional vibration mode. Here, three internal electrodes 32–34 are disposed in a piezoelectric body 12. Polarization is carried out, using these internal electrodes 32–34, such that piezoelectric layers disposed adjacent to each other in the direction of thickness are polarized in opposite directions.

Therefore, the resonator 31 is constructed to be operated as a piezoelectric resonator utilizing the fourth-order wave of a thickness extensional vibration mode by applying an AC voltage via the first and second excitation electrodes 13, 14.

In the thickness extensional vibration piezoelectric resonators shown in FIGS. 10–13, vibration-attenuating portions are located only along one direction as described above. The first and second excitation electrodes are arranged to extend to or near to the sides of the piezoelectric body in a direction substantially perpendicular to the one direction of the vibrating attenuating portions. Therefore, a small-sized thickness extensional vibration mode piezoelectric resonator can be manufactured. All of these resonators preferably have internal electrodes which increases the electric capacitance and makes the resonator not susceptible to the effects of stray capacitance of the circuit board upon which the resonator is mounted.

In addition, the thickness extensional piezoelectric resonators shown in FIGS. 10–13 effectively suppress unwanted spurious vibrations caused by lateral modes or caused by the responses of other harmonics by making the piezoelectric body or strip 2, 12 of a piezoelectric material having a piezoelectric constant $d_{31}$ whose absolute value is less than about $20 \times 10^{-12}$ C/N and by making use of harmonics of the thickness extensional vibration mode in the same way as in the first and second preferred embodiments.

Figure 14:
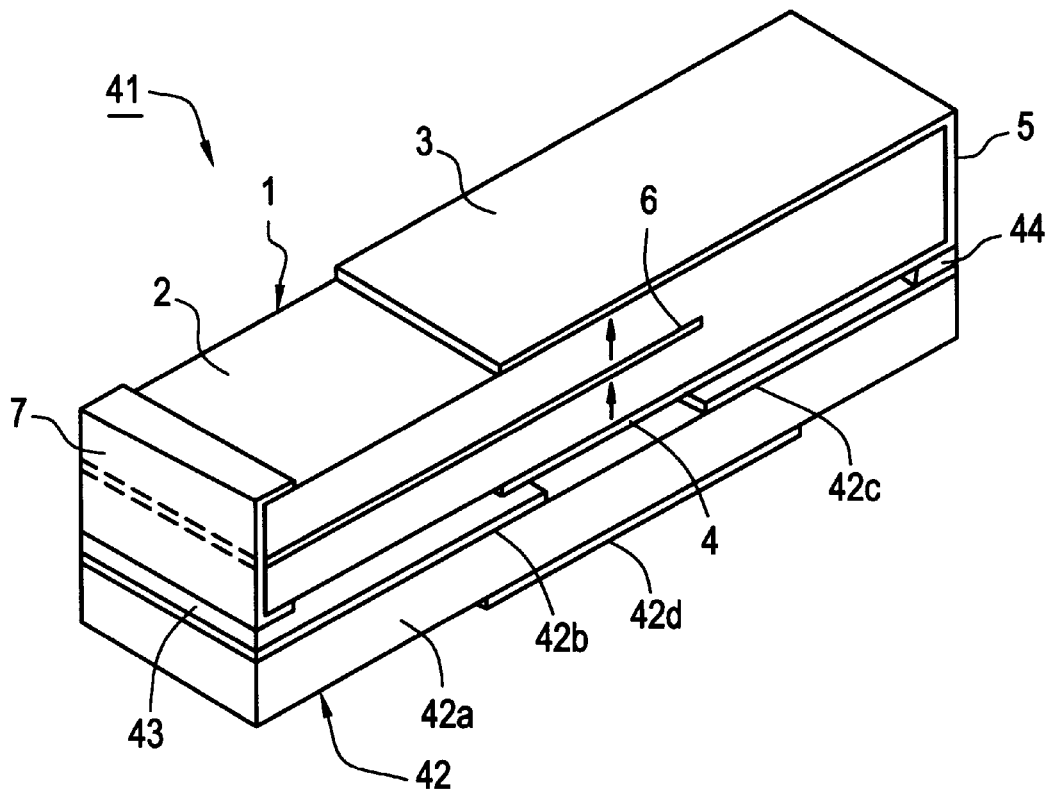
FIG. 14 is a perspective view showing a piezoelectric resonator including a built-in capacitor, the resonator being constructed according to the third preferred embodiment of the present invention.
Figure 15:
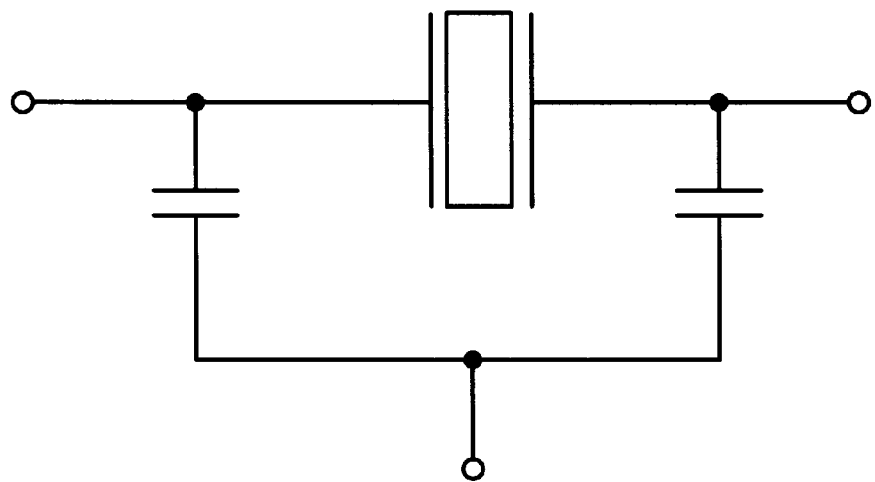
FIG. 15 is a diagram showing the circuit configuration of the piezoelectric resonator shown in FIG. 14.

FIG. 14 is a perspective view for illustrating a thickness extensional piezoelectric resonator according to a third preferred embodiment of the present invention. FIG. 15 is a diagram showing its equivalent circuit. FIG. 14 shows a piezoelectric resonator 41 that is a combination of the thickness extensional piezoelectric resonator 1 according to the first preferred embodiment and a capacitor 42. The capacitor 42 is bonded to the bottom surface of the thickness extensional piezoelectric resonator 1 via conductive adhesive 43, 44.

In the capacitor 42, capacitive electrodes 42b and 42c are formed via a gap on the top surface of a dielectric substrate 42a. A common electrode 42d is disposed on the bottom surface of the dielectric substrate 42a. The common electrode 42d and the capacitive electrodes 42b, 42c are located on opposite sides of the dielectric substrate 42a.

The conductive adhesive 43 bonds the capacitive electrode 42b to a terminal electrode 7. The conductive adhesive 44 bonds the capacitive electrode 42c to a terminal electrode 5.

Therefore, as shown in FIG. 15, the piezoelectric resonator 41 can be used as a piezoelectric resonator where two capacitive units are combined.

The lateral dimension of the thickness extensional piezoelectric resonator 1 is significantly reduced and, therefore, a piezoelectric resonator that has a built-in capacitor but still has a very small size is provided. Furthermore, the thickness extensional piezoelectric resonator 1 has internal electrodes. As a result, the resonator device is not significantly affected by the stray capacitance of the circuit board and the stray capacitance of the capacitor 42. Moreover, the thickness extensional piezoelectric resonator 1 is a piezoelectric resonator utilizing the second-order waves of thickness extensional vibrations. Spurious vibrations caused by lateral modes $WE_1$, $WE_2$, and sixth-order waves $TE_6$ are effectively suppressed. Therefore, piezoelectric resonators having excellent frequency characteristics are provided.

Figure 16:
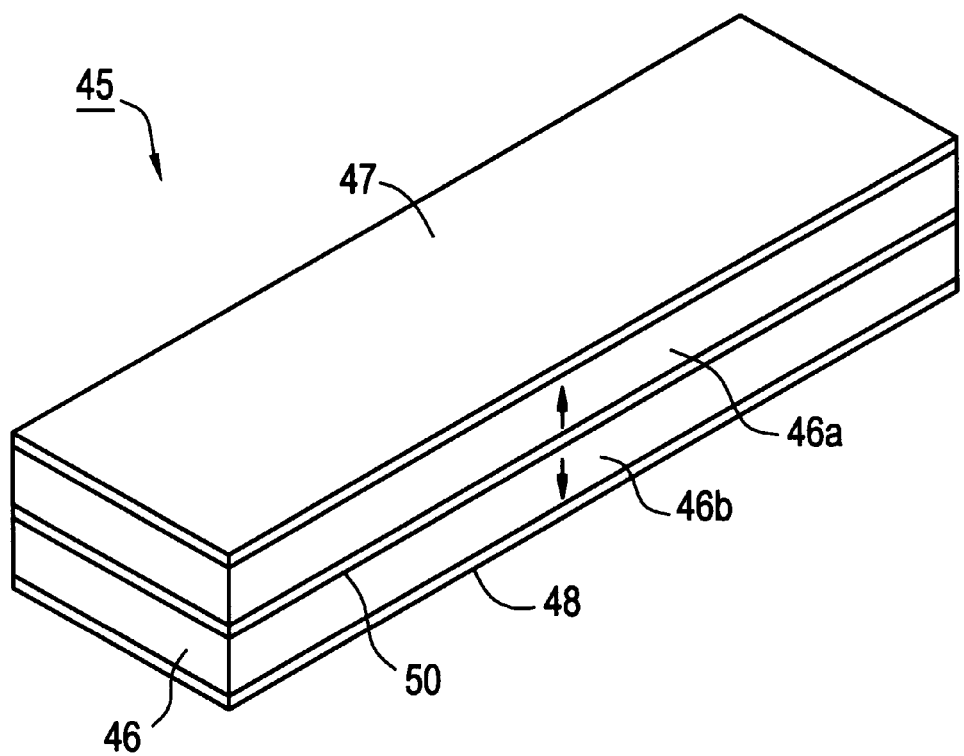
FIG. 16 is a perspective view illustrating a further modified example of a thickness extensional piezoelectric resonator according to preferred embodiments of the present invention.

FIG. 16 is a perspective view showing a further modified example of the thickness extensional piezoelectric resonator in accordance with preferred embodiments of the present invention.

A thickness extensional piezoelectric resonator apparatus according to preferred embodiments of the invention includes a piezoelectric resonator making use of harmonics of thickness extensional vibrations and includes a piezoelectric strip made of a material having an absolute value of a piezoelectric constant $d_{31}$ is preferably less than about $20\times10^{-12}$ C/N, thus suppressing unwanted spurious vibrations caused by lateral modes and other harmonics. That is, the present invention is not limited to an energy-trap piezoelectric resonator. As shown in FIG. 16, the present invention can also be applied to a thickness extensional piezoelectric resonator other than the energy-trap type.

Referring to FIG. 16, a thickness extensional piezoelectric resonator 45 includes an elongated, substantially rectangular piezoelectric strip 46. The piezoelectric strip 46 is preferably made of a piezoelectric material having a dielectric constant $d_{31}$ with an absolute value less than about $20\times10^{-12}$ C/N. A first excitation electrode 47 and a second excitation electrode 48 are arranged to cover the whole top surface and the whole bottom surface, respectively, of the piezoelectric strip 46. An internal electrode 50 is disposed inside the piezoelectric strip. In this piezoelectric strip 46, adjacent piezoelectric layers 46a and 46b are polarized oppositely in the direction of thickness.

Also, in the piezoelectric resonator 45, the piezoelectric strip is preferably made of a piezoelectric material having the piezoelectric constant described above. Unwanted spurious vibrations caused by lateral modes and other harmonics are effectively suppressed, in the same way as in the thickness extensional piezoelectric resonator 11 according to the second preferred embodiment. Excellent resonant characteristics are therefore achieved.

Figure 17:
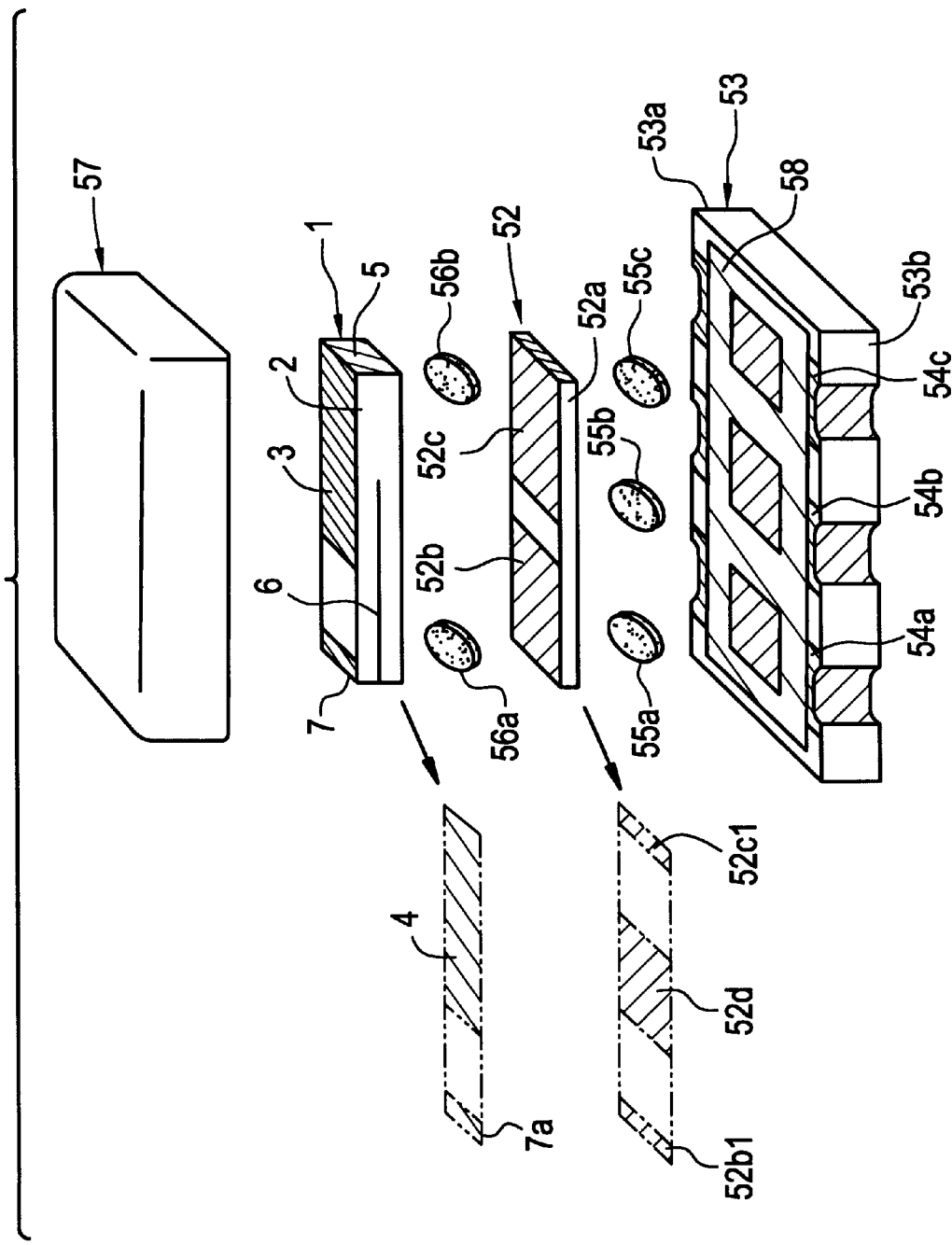
FIG. 17 is an exploded perspective view illustrating a preferred embodiment of a chip-type piezoelectric resonator component in accordance with the present invention.
Figure 18:
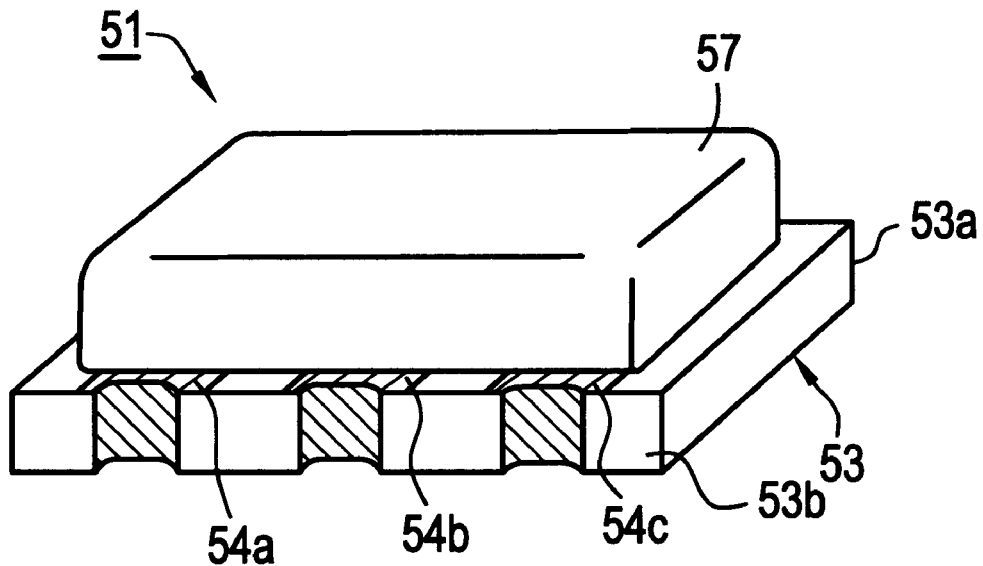
FIG. 18 is a perspective view showing the appearance of the chip-type piezoelectric resonator component shown in FIG. 17.
Figure 19:
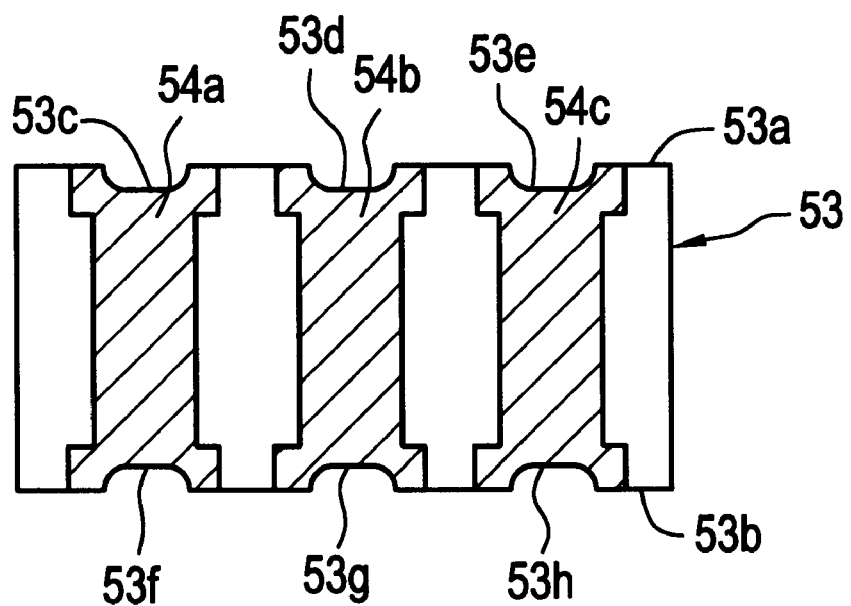
FIG. 19 is a plan view of a case substrate functioning as a first case member used in the chip-type piezoelectric resonator component shown in FIG. 17.
Figure 20:
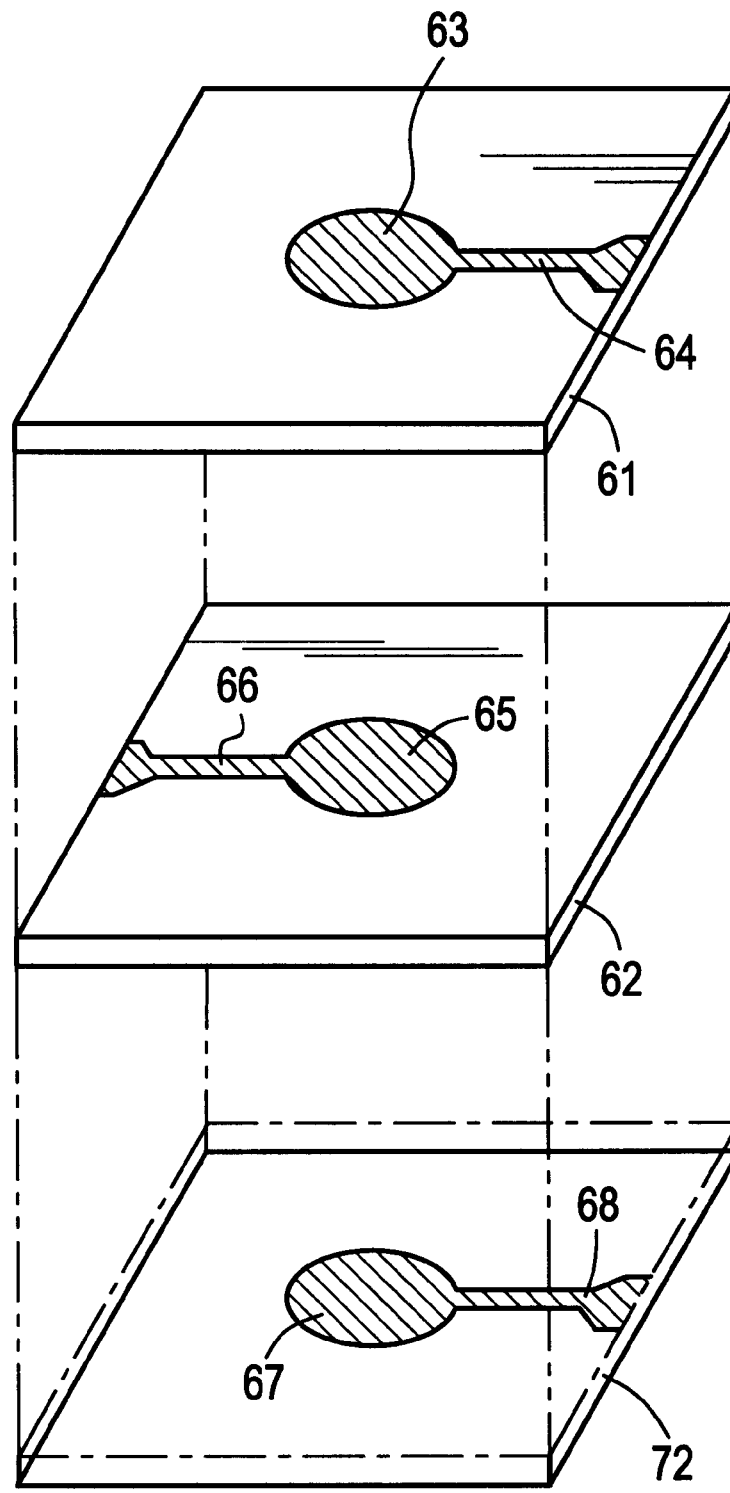
FIG. 20 is an exploded perspective view illustrating one example of the prior art thickness extensional piezoelectric resonator.
Figure 21:
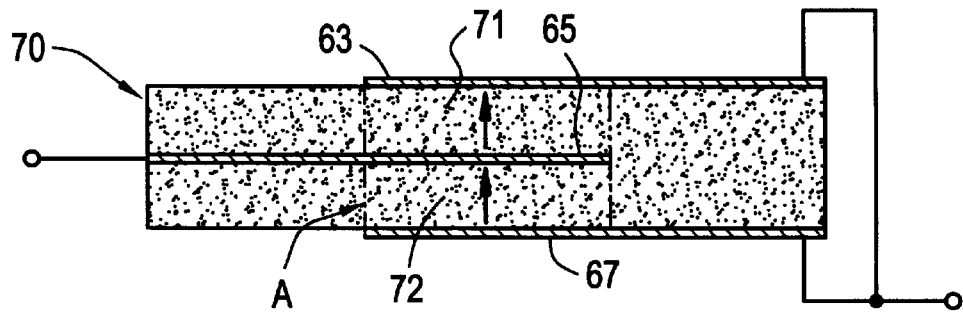
FIG. 21 is a cross-sectional view of the thickness extensional piezoelectric resonator shown in FIG. 20.

Preferred embodiments of a chip-type piezoelectric resonator component in accordance with the present invention are described by referring to FIGS. 17–19.

FIG. 17 is an exploded perspective view of a chip-type piezoelectric resonator component in accordance with a preferred embodiment of the present invention. FIG. 18 is a perspective view showing the assembled form of the component shown in FIG. 17. The chip-type piezoelectric resonator 51 includes a thickness extensional vibration mode piezoelectric resonator 1 according to the first preferred embodiment and a capacitor 52 preferably arranged in the form of a flat plate. Both resonator 1 and capacitor 52 are contained in a case including a case substrate 53 defining a first case member and a metallic cap 57 bonded onto the case substrate 53.

The case substrate 53 is preferably made of an insulating material such as alumina or synthetic resin.

As shown in the plan view of FIG. 19, notches 53c–53e, 53f–53h are preferably formed in the side surfaces 53a and 53b of the case substrate 53.

An electrode land 54a is disposed on the top surface of the case substrate 53 so as to connect the notches 53c and 53f. The electrode land 54a defines a portion for making electrical connection and extends into the notches 53c and 53f. The extension portion of the electrode land extending into the notches 53c and 53f defines an outer electrode. Similarly, an electrode land 54b is disposed on the top surface of the case substrate 53 to connect the notches 53d and 53g in the electrode land 54b. The extension portion extending into the notches 53d and 53g in the electrode land 54b constitutes an outer electrode. Likewise, an electrode land 54c is located on the top surface of the case substrate 53 to connect the notches 53e and 53h. Extension portions extending into the notches 53e and 53h at both ends of the electrode land 54c define outer electrodes.

The capacitor 52 is bonded onto the case substrate 53 via conductive bonding materials 55a–55c, such as a conductive adhesive. The capacitor 52 is constructed preferably to include a substantially rectangular dielectric substrate 52a made of a dielectric material such as a dielectric ceramic. A pair of capacitive electrodes 52b and 52c are arranged opposite to each other in the central region on the top surface of the dielectric substrate 52a. As shown to the left of FIG. 17 by the imaginary lines, a capacitive electrode 52d is disposed in the approximate center and is arranged to partially face the capacitive electrodes 52b and 52c.

The capacitive electrodes 52b and 52c are arranged so as to extend from the end surface to the bottom surface at the longitudinal ends of the dielectric substrate 52a. In particular, the capacitive electrode 52d is located at the approximate center of the bottom surface of the dielectric substrate 52a. The capacitive electrodes 52b and 52c have electrode extension portions $52b_1$ and $52c_1$ located at the opposite longitudinal ends, respectively.

The aforementioned conductive bonding materials 55a–55c are bonded to the electrode extension portions $52b_1$, capacitive electrode 52d, and capacitive electrode extension portion $52c_1$, respectively, and connects these elements to the electrode lands 54a–54c, respectively.

Accordingly, the conductive bonding materials 55a–55c mechanically join the plate-shaped capacitor 52 to the case substrate 53. The plate-shaped capacitor 52 is electrically connected with the electrode lands 54a–54c, respectively.

The thickness extensional vibration mode piezoelectric resonator 1 is bonded onto the plate-shaped capacitor 52 via the conductive bonding materials 56a and 56b.

As indicated by the imaginary lines in FIG. 17, the extension portion 7a of the connector electrode 7 connected with the internal electrodes 6 and the second excitation electrode 4 are positioned on the bottom surface of the thickness extensional piezoelectric resonator 1. The conductive bonding material 56a electrically connects the electrode extension portion 7a of the connector electrode 7 with the capacitive electrode 52b of the plate-shaped capacitor 52. The conductive bonding material 56b is bonded to the conductive bonding material 56b near the portions of the second excitation electrode 4 of the thickness extensional piezoelectric resonator 1 that are close to the ends of the piezoelectric plate 2. The excitation electrode 4 and the capacitive electrode 52c are electrically connected together.

After the conductive bonding materials 56a and 56b have been cured to have a given thickness in order to secure a space which allows unhindered vibration of the vibrating portion of the thickness extensional piezoelectric resonator 1 when this resonator 1 is bonded onto the plate-shaped capacitor 52.

In the chip-type piezoelectric resonator component according to the present preferred embodiment, the plate-shaped capacitor 52 and the thickness extensional piezoelectric resonator 1 are stacked onto the case substrate 53, and then the metallic cap 57 is joined to the case substrate 53. The metallic cap 57 is preferably made of a metal to enhance the electromagnetic shielding properties thereof. To prevent shorting to the electrode lands 54a–54c and to the outer electrodes, a dielectric film 57 is applied to the portion of the case substrate 53 where the metallic cap 57 is joined before the cap 57 is joined. The dielectric film 58 can be preferably made of an appropriate synthetic resin as long as the shorting to the electrode lands 54a–54c and to the outer electrodes can be prevented. The thickness of the dielectric film is set to an appropriate value as long as the above-described electrical insulation can be accomplished.

A dielectric adhesive is applied to the dielectric film 57, and the metallic cap 57 is joined with this dielectric adhesive. In this case, the dielectric film 58 itself may be made of a dielectric adhesive, and the metallic cap 57 may be bonded to the case substrate 53.

The chip-type piezoelectric resonator part 51 shown in FIG. 18 is assembled and arranged as described above.

The chip-type piezoelectric resonator part 51 according to the present preferred embodiment uses the aforementioned thickness extensional vibration mode piezoelectric resonator 1. Therefore, the lateral dimension is significantly reduced as described above. The size of the entire chip-type piezoelectric resonator component is significantly reduced. The thickness extensional piezoelectric resonator 1 produces no unwanted spurious components. As a result, excellent resonant characteristics are obtained in the same way as in the first preferred embodiment.

Additionally, the plate-shaped capacitor 52 reinforces the thickness extensional piezoelectric resonator 1, because the resonator 1 is coupled to the plate-shaped capacitor 52. That is, if the resonator 1 is thin, it can be reinforced by being mechanically bonded to the plate-shaped capacitor 52.

Preferably, the lateral dimension of the plate-shaped capacitor 52 described above is greater than the lateral dimension of the thickness extensional piezoelectric resonator 1. The inner wall of the metallic cap 57 can be prevented from touching the thickness extensional piezoelectric resonator 1 by setting the lateral dimension of the plate-shaped capacitor 52 greater than the lateral dimension of the resonator 1.

While the invention has been particularly shown and described with reference to preferred embodiments thereof, it will be understood by those skilled in the art that the forgoing and other changes in form and details may be made therein without departing from the spirit of the invention.

What is claimed is:

1. A thickness extensional vibration mode piezoelectric resonator, said piezoelectric resonator comprising:

a substantially rectangular piezoelectric plate having first and second external surfaces opposite to each other;

a first excitation electrode located on said first external surface of said piezoelectric plate;

a second excitation electrode located on said second external surface of said piezoelectric plate and arranged to be opposed to said first excitation electrode with said piezoelectric plate located therebetween;

at least one internal electrode disposed in said piezoelectric plate and arranged at least partially opposed to the first and second excitation electrodes and so as to extend to both sides of the piezoelectric plate;

a resonating portion defined by opposed portions of said first and second excitation electrodes, said internal electrode, and said piezoelectric plate;

a plurality of vibration-attenuating portions disposed on both sides of said resonating portion along only one direction; and said first and second excitation electrodes extending substantially to both sides of the piezoelectric plate in a direction substantially perpendicular to said one direction.

2. A thickness extensional vibration mode piezoelectric resonator comprising:

a substantially rectangular piezoelectric plate having first and second external surfaces opposite to each other;

a first excitation electrode located on said first external surface of said piezoelectric plate;

a second excitation electrode located on said second external surface of said piezoelectric plate and arranged to be opposed to said first excitation electrode with said piezoelectric plate located therebetween;

at least one internal electrode disposed in said piezoelectric plate and arranged at least partially opposed to the first and second excitation electrodes and so as to extend to both sides of the piezoelectric plate; wherein said piezoelectric plate is made of a piezoelectric material having a piezoelectric constant $d_{31}$ defined by $|d_{31}| \leq 20 \times 10^{-12}$ C/N;

said first and second excitation electrodes extending substantially to both sides of the piezoelectric plate in a direction substantially perpendicular to said one direction.

3. A thickness extensional vibration mode piezoelectric resonator according to claim 1, wherein said piezoelectric plate is made of a piezoelectric material having a piezoelectric constant $d_{31}$ defined by $|d_{31}| \leq 20 \times 10^{-12}$ C/N.

4. A thickness extensional vibration mode piezoelectric resonator according to claim 1, wherein said piezoelectric plate has an elongated strip shape.

5. A thickness extensional vibration mode piezoelectric resonator according to claim 2, wherein said piezoelectric plate has an elongated strip shape.

6. A thickness extensional vibration mode piezoelectric resonator according to claim 3, wherein said piezoelectric plate has an elongated strip shape.

7. A thickness extensional vibration mode piezoelectric resonator according to claim 1, further comprising a capacitor disposed on said first and second surfaces of said piezoelectric plate with a space therebetween which is arranged to allow for unimpeded vibration of the piezoelectric resonator.

8. A thickness extensional vibration mode piezoelectric resonator according to claim 2, further comprising a capacitor disposed on said first and second surfaces of said piezoelectric plate with a space therebetween which is arranged to allow for unimpeded vibration of the piezoelectric resonator.

9. A thickness extensional vibration mode piezoelectric resonator according to claim 3, further comprising a capacitor disposed on said first and second surfaces of said piezoelectric plate with a space therebetween which is arranged to allow for unimpeded vibration of the piezoelectric resonator.

10. A thickness extensional vibration mode piezoelectric resonator according to claim 4, further comprising a capacitor disposed on said first and second surfaces of said piezoelectric plate with a space therebetween which is arranged to allow for unimpeded vibration of the piezoelectric resonator.

11. A thickness extensional vibration mode piezoelectric resonator according to claim 5, further comprising a capacitor disposed on said first and second surfaces of said piezoelectric plate with a space therebetween which is arranged to allow for unimpeded vibration of the piezoelectric resonator.

12. A thickness extensional vibration mode piezoelectric resonator according to claim 6, further comprising a capacitor disposed on said first and second surfaces of said piezoelectric plate with a space therebetween which is arranged to allow for unimpeded vibration of the piezoelectric resonator.

13. A piezoelectric resonator component, comprising:

a casing including a first case member and a second case member;

electrode lands provided on a top surface of the first case member;

a plurality of outer electrodes electrically connected to said electrode lands and extending to an outer surface of said casing;

a plate-shaped capacitor located on the top surface of said first case member and electrically connected to said electrode lands;

a thickness extensional vibration mode piezoelectric resonator including:

a substantially rectangular piezoelectric plate having first and second external surfaces opposite to each other;

a first excitation electrode located on said first external surface of said piezoelectric plate;

a second excitation electrode located on said second external surface of said piezoelectric plate and arranged to be opposed to said first excitation electrode with said piezoelectric plate located therebetween;

at least one internal electrode disposed in said piezoelectric plate and arranged at least partially opposed to the first and second excitation electrodes and so as to extend to both sides of the piezoelectric plate;

a resonating portion defined by opposed portions of said first and second excitation electrodes, said internal electrode, and said piezoelectric plate;

a plurality of vibration-attenuating portions disposed on both sides of said resonating portion along only one direction; and said first and second excitation electrodes extending substantially to both sides of the piezoelectric plate in a direction substantially perpendicular to said one direction;

the resonator and the capacitor being arranged so as to define a space which allows the resonator to vibrate unimpeded; and said second case member being fixedly mounted to the first case member so as to surround the plate-shaped capacitor and the thickness extensional vibration mode piezoelectric resonator stacked on the top surface of said first case member.

14. A piezoelectric resonator component, comprising:

a casing including a first case member and a second case member;

electrode lands provided on a top surface of the first case member;

a plurality of outer electrodes electrically connected to said electrode lands and extending to an outer surface of said casing;

a plate-shaped capacitor located on the top surface of said first case member and electrically connected to said electrode lands;

a thickness extensional vibration mode piezoelectric resonator including:

a substantially rectangular piezoelectric plate having first and second external surfaces opposite to each other;

a first excitation electrode located on said first external surface of said piezoelectric plate;

a second excitation electrode located on said second external surface of said piezoelectric plate and arranged to be opposed to said first excitation electrode with said piezoelectric plate located therebetween;

at least one internal electrode disposed in said piezoelectric plate and arranged at least partially opposed to the first and second excitation electrodes and so as to extend to both sides of the piezoelectric plate; wherein said piezoelectric plate is made of a piezoelectric material having a piezoelectric constant $d_{31}$ defined by $|d_{31}| \leq 20 \times 10^{-12}$ C/N;

said first and second excitation electrodes extending substantially to both sides of the piezoelectric plate in a direction substantially perpendicular to said one direction;

said first and second excitation electrodes extending substantially to both sides of the piezoelectric plate in a direction substantially perpendicular to said one direction;

the resonator and the capacitor being arranged so as to define a space which allows the resonator to vibrate unimpeded; and said second case member being fixedly mounted to the first case member so as to surround the plate-shaped capacitor and the thickness extensional vibration mode piezoelectric resonator stacked on the top surface of said first case member.

15. A piezoelectric resonator component according to claim 13, wherein said piezoelectric plate is made of a piezoelectric material having a piezoelectric constant $d_{31}$ defined by $|d_{31}| \leq 20 \times 10^{-12}$ C/N.

16. A piezoelectric resonator component according to claim 13, wherein said piezoelectric plate has an elongated strip shape.

17. A piezoelectric resonator component according to claim 14, wherein said piezoelectric plate has an elongated strip shape.

18. A piezoelectric resonator component according to claim 14, further comprising a resonating portion defined by opposed portions of said first and second excitation electrodes, said internal electrode, and said piezoelectric plate;

a plurality of vibration-attenuating portions disposed on both sides of said resonating portion along only one direction; and said first and second excitation electrodes extending substantially to both ends of the piezoelectric plate in a direction substantially perpendicular to said one direction.

* * * * *